United States Patent
Cheng et al.

(10) Patent No.: US 10,720,527 B2
(45) Date of Patent: Jul. 21, 2020

(54) TRANSISTOR HAVING AN OXIDE-ISOLATED STRAINED CHANNEL FIN ON A BULK SUBSTRATE

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Peng Xu, Sunnyvale, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 15/861,127

(22) Filed: Jan. 3, 2018

(65) Prior Publication Data
US 2019/0207028 A1 Jul. 4, 2019

(51) Int. Cl.
*H01L 29/78* (2006.01)
*H01L 29/66* (2006.01)
*H01L 29/16* (2006.01)

(52) U.S. Cl.
CPC .... *H01L 29/7847* (2013.01); *H01L 29/66795* (2013.01); *H01L 29/785* (2013.01); *H01L 29/7849* (2013.01); *H01L 29/7851* (2013.01); *H01L 29/16* (2013.01)

(58) Field of Classification Search
CPC ............. H01L 29/66795; H01L 29/785; H01L 29/66484; H01L 29/66431; H01L 29/66818; H01L 29/7831; H01L 29/1054; H01L 2029/7858; H01L 29/41791; H01L 29/7851; H01L 29/8124
See application file for complete search history.

(56) References Cited

U.S. PATENT DOCUMENTS

| | | | |
|---|---|---|---|
| 6,855,436 B2 | 2/2005 | Bedell et al. | |
| 7,304,336 B2 | 12/2007 | Cheng et al. | |
| 8,211,772 B2 | 7/2012 | Kavalieros et al. | |
| 9,048,087 B2 * | 6/2015 | Wu | H01L 21/0206 |
| 9,093,326 B2 | 7/2015 | Cheng et al. | |
| 9,502,540 B1 | 11/2016 | Bedell et al. | |
| 9,601,386 B1 | 3/2017 | He et al. | |

(Continued)

OTHER PUBLICATIONS

Cheng et al., "Bottom oxidation through STI (BOTS)—A Novel Approach to Fabricate Dielectric Isolated FinFET on Bulk Substrates," 2014 Symposium on VLSI Technology (VLSI-Technology): Digest of Technical Papers, IEEE, 2014, 3 pages.

(Continued)

*Primary Examiner* — Khiem D Nguyen
(74) *Attorney, Agent, or Firm* — Cantor Colburn LLP; Vazken Alexanian

(57) ABSTRACT

Embodiments of the invention are directed to a semiconductor device that includes a substrate formed from a first type of semiconductor material, along with a fin formed on the substrate. The fin includes a fin channel region configured to include a bottom region, a central region, and a top active region. The central region includes a dielectric material and couples the bottom region to the top active region. The top active region includes a second type of semiconductor material, and the bottom region includes a third type of semiconductor material.

18 Claims, 12 Drawing Sheets

(56) References Cited

U.S. PATENT DOCUMENTS

| | | | |
|---|---|---|---|
| 9,614,077 B1 | 4/2017 | Cheng et al. | |
| 9,614,086 B1* | 4/2017 | Yeo | H01L 23/535 |
| 9,647,112 B1 | 5/2017 | Balakrishnan et al. | |
| 9,773,875 B1* | 9/2017 | Jagannathan | H01L 29/165 |
| 10,170,554 B2* | 1/2019 | Hsieh | H01L 29/0847 |
| 2007/0120156 A1* | 5/2007 | Liu | H01L 27/0207 |
| | | | 257/288 |
| 2010/0163971 A1* | 7/2010 | Hung | H01L 29/66795 |
| | | | 257/327 |
| 2010/0252816 A1* | 10/2010 | Ko | H01L 29/66818 |
| | | | 257/24 |
| 2014/0110669 A1* | 4/2014 | Rachmady | B82Y 10/00 |
| | | | 257/24 |
| 2014/0197456 A1* | 7/2014 | Wang | H01L 29/785 |
| | | | 257/192 |
| 2014/0197457 A1* | 7/2014 | Wang | H01L 29/785 |
| | | | 257/192 |
| 2014/0319462 A1* | 10/2014 | Huang | H01L 29/785 |
| | | | 257/18 |
| 2014/0353731 A1* | 12/2014 | Colinge | H01L 29/7843 |
| | | | 257/288 |
| 2015/0011056 A1* | 1/2015 | Kapoor | H01L 29/78654 |
| | | | 438/163 |
| 2015/0021697 A1* | 1/2015 | Colinge | H01L 29/7848 |
| | | | 257/368 |
| 2015/0311207 A1* | 10/2015 | Ching | H01L 27/0924 |
| | | | 257/192 |
| 2015/0357443 A1* | 12/2015 | Ching | H01L 29/785 |
| | | | 257/190 |
| 2016/0293750 A1* | 10/2016 | Kim | H01L 29/7848 |
| 2018/0006155 A1* | 1/2018 | Holt | H01L 29/7849 |

OTHER PUBLICATIONS

Mitard et al., "15nm-W FIN High-Performance Low-Defectivity Strained-Germanium pFinFETs with Low Temperature STI-Last Process," 2014 Symposium on VLSI Technology Digest of Technical Papers, IEEE, 2014, 2 pages.

Witters et al., "Strained Germanium Gate-All-Around pMOS Device Demonstration Using Selective Wire Release Etch Prior to Replacement Metal Gate Deposition," IEEE Transactions on Electron Devices, vol. 64, No. 11, Nov. 2017, pp. 4587-4593.

* cited by examiner

US 10,720,527 B2

TRANSISTOR HAVING AN OXIDE-ISOLATED STRAINED CHANNEL FIN ON A BULK SUBSTRATE

BACKGROUND

The present invention relates in general to semiconductor devices for use in integrated circuits (ICs). More specifically, the present invention relates to improved fabrication methodologies and resulting structures for semiconductor device configurations (e.g., fin-type field effect transistors (FinFETs)) in which an oxide-isolated strained channel fin on a bulk substrate is provided.

Transistors are fundamental device elements of modern digital processors and memory devices. A transistor type that has emerged within the metal-oxide-semiconductor field-effect transistor (MOSFET) family of transistors, and which shows promise for scaling to ultra-high density and nanometer-scale channel lengths, is a so-called FinFET device. FinFETs are non-planar, three-dimensional (3D) devices that include a fin-shaped channel with a gate formed along the sidewalls and top surface of the channel. The use of silicon germanium in semiconductor devices such as FinFETs provides desirable device characteristics, including the introduction of strain at the interface between the silicon germanium of the active device and the underlying silicon substrate.

FinFETs can be formed on bulk wafer substrates or on SOI (silicon-on-insulator) substrates. In bulk wafers, isolation is formed with implanted wells and shallow trench isolation (STI) oxide separating one fin from another. In SOI, the fins are formed in the silicon layer, and no wells are needed because of the isolating dielectric that is already present in the SOI wafer.

SUMMARY

Embodiments of the invention are directed to a semiconductor device that includes a substrate formed from a first type of semiconductor material, along with a fin formed on the substrate. The fin includes a fin channel region configured to include a bottom region, a central region, and a top active region. The central region includes a dielectric material and couples the bottom region to the top active region. The top active region includes a second type of semiconductor material, and the bottom region includes a third type of semiconductor material.

Embodiments of the invention are directed to a method of forming a semiconductor device. The method includes forming a substrate formed from a first type of semiconductor material, along with forming a fin formed on the substrate. The fin includes a fin channel region configured to include a bottom region, a central region, and a top active region. The central region includes a dielectric material and couples the bottom region to the top active region. The active region is formed from a second type of semiconductor material, and the bottom region is formed from a third type of semiconductor material.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

It is understood in advance that, although this detailed description includes FinFET devices having fins silicon germanium regions and germanium regions, implementation of the teachings recited herein are not limited to a particular type of FET structure or combination of semiconductor materials. Rather, embodiments of the present invention are capable of being implemented in conjunction with any other type of fin-based transistor device or semiconductor material, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, semiconductor devices are typically formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
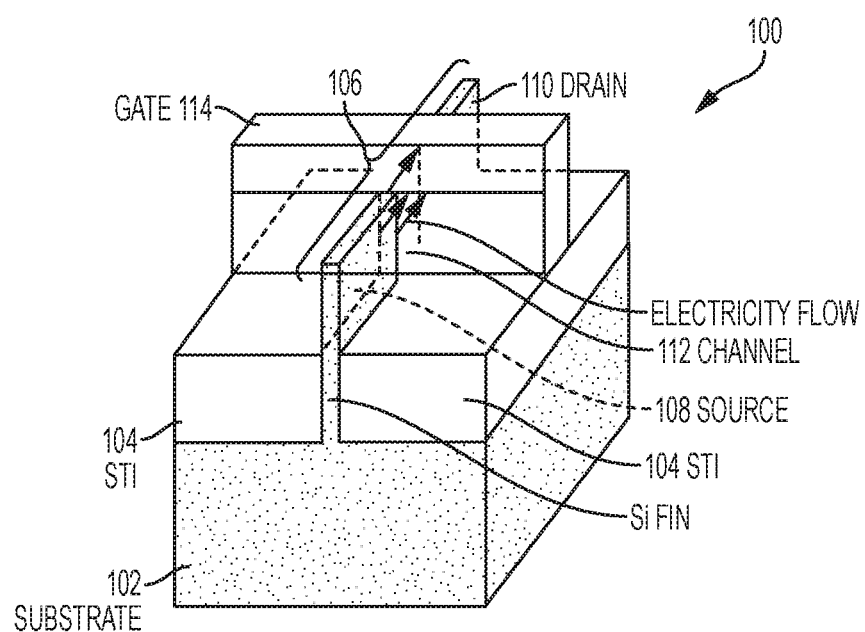
FIG. 1 depicts a three-dimensional view of an example configuration of a known FinFET device.

One particularly advantageous type of MOSFET is known generally as a fin-type field effect transistor (FinFET), an example of which is shown in FIG. 1 as a three-dimensional view of a FinFET 100. The basic electrical layout and mode of operation of FinFET 100 do not differ significantly from a traditional field effect transistor. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., silicon oxide), and fin 106 can be silicon that has been enriched to a desired concentration level of germanium. Gate 114 controls the source to drain current flow (labeled ELECTRICITY FLOW in FIG. 1).

In contrast to planar MOSFETs, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

The use of silicon germanium in semiconductor devices provides desirable device characteristics, including the introduction of strain in a silicon germanium channel to enhance carrier mobility and thus transistor performance. The compressive strain (typically expressed as a percentage) introduced by using silicon germanium in the active region of a semiconductor device is based on the concentration of germanium introduced into the silicon. For example, a silicon germanium feature (e.g., a fin) having a 25% concentration of germanium can exhibit a nominal compressive strain of 0.01 (or 1%) with a +/−5% variation. It is desirable to substantially maintain the compressive strain within a predetermined variation throughout the volume of the feature.

Strained silicon transistors increase the mobility of charge carriers, i.e., electrons or holes, passing through a semiconductor lattice. Incorporating strain into the channel of a semiconductor device stretches the crystal lattice, thereby increasing charge carrier mobility in the channel so that the device becomes a more responsive switch. Introducing a compressive strain into a PFET transistor tends to increase hole mobility in the channel, resulting in a faster switching response to changes in voltage applied to the transistor gate. Likewise, introducing a tensile strain into an NFET transistor tends to increase electron mobility in the channel, also resulting in a faster switching response.

There are many ways to introduce tensile or compressive strain into transistors, for both planar devices and FinFETs. In general, such techniques typically entail incorporating into the device epitaxial layers of one or more materials having crystal lattice dimensions or geometries that differ slightly from those of the silicon substrate. The epitaxial layers can be made of doped silicon or silicon germanium (SiGe), for example. Such epitaxial layers can be incorporated into source and drain regions, into the transistor gate that is used to modulate current flow in the channel, or into the channel itself, which is a portion of the fin. For example, one way to introduce strain is to replace bulk silicon from the source and drain regions, or from the channel, with silicon compounds such as silicon germanium (SiGe), for example. Because Si—Ge bonds are longer than Si—Si bonds, there is more open space in a SiGe lattice. The presence of germanium atoms having longer bonds stretches the lattice, causing internal strain. Electrons can move more freely through a lattice that contains elongated Si—Ge and Ge—Ge bonds, than through a lattice that contains shorter Si—Si bonds. Replacing silicon atoms with SiGe atoms can be accomplished during a controlled process of epitaxial crystal growth, in which a new SiGe crystal layer is grown from the surface of a bulk silicon crystal, while maintaining the same crystal structure of the underlying bulk silicon crystal. Alternatively, strain can be induced in the fin from below the device by using various types of SOI substrates, which features a buried insulator, typically a buried oxide layer (BOX) underneath the active area. In comparison to bulk silicon substrates, SOI substrates involve significantly greater fabrication costs. Accordingly bulk substrates are more commonly used than SOI.

Strain and mobility effects can be tuned by controlling the elemental composition within the epitaxially grown crystal. For example, it has been determined that epitaxial SiGe films containing a high concentration of germanium, e.g., in the range of 25%-40%, provide enhanced electron mobility compared with lower concentration SiGe films. Thus, from the point of view of device performance, it is generally advantageous to increase the percent concentration of germanium atoms in the fins in a FinFET. However, the lattice structures of high germanium concentration films tend to be mechanically unstable, especially if they contain a high number of dislocation type defects. It is understood that films having such a high germanium concentration can be stabilized if they are grown from a silicon substrate that includes a strain-relaxed buffer (SRB) layer. It is important, however, for the SRB layer to be free of defects to prevent defect propagation to the surface of the SRB layer, which can contaminate the active region where the FinFET is formed. Conventional SiGe SRB films are not defect free. Defects in the SRB layer can cause excessive current leakage, as well as device variability and poor reliability. Additionally, when FinFETs are formed by growing strained Ge fins from an SRB (SiGe70%) seed layer, the resulting FinFETs suffer from high off-current due to the lower energy band gap and parasitic channel formation at the bottom portion of the fin.

As previously noted herein, FinFETs can be formed on bulk wafer substrates or on SOI substrates. In bulk wafers, as depicted in FIG. 1, isolation is formed with implanted wells and STI oxide separating one fin from another. In SOI, the fins are formed in the silicon layer, and no wells are needed because of the isolating dielectric that is already present in the SOI wafer. Because fabricating FinFETs on SOI substrates can be expensive, FinFETs are typically formed on bulk wafer substrates. However, forming FinFETs on bulk wafer substrates presents a number of challenges. Current bulk FinFET process flows require a punch through stopper (PTS) layer below the active fin to suppress the presence of an off-state current. Forming the PTS layer requires channel doping during the downstream thermal process. Such doping can result in mobility degradation, threshold voltage variations, and random-dopant-fluctuation. Non-uniform doping is particularly egregious as it increases capacitance without a concomitant increase in drive current. Additionally, with aggressive device scaling (e.g., tighter fin pitch), it becomes more difficult to achieve an accurate effective fin width due to variations of STI recess processes. Junction leakage current and sub-fin leakage paths are also major concerns when fabricating FinFET devices on bulk wafer substrates.

Turning now to an overview of aspects of the present invention, embodiments of the invention provide improved fabrication methodologies and resulting structures for semiconductor device configurations (e.g., FinFETs) in which an oxide-isolated strained channel fin on a bulk substrate is provided. Embodiments of the invention provide methods and resulting structures for a novel fin structure that can be used in 3D MOSFET transistors such as FinFET devices. The novel fin structure provides isolation and strain by providing a fin channel having a bottom SRB region, a top active region and a central isolation region, all of which are formed over a bulk substrate. In embodiments of the invention, the bottom SRB region is adjacent to the substrate, and the central isolation region is positioned between the bottom SRB region and the top active region. In embodiments of the invention, the substrate is formed from a first type of semiconductor material, the top active region is formed from a second type of semiconductor material, the bottom SRB region is formed from a combination of the first type of semiconductor material and the second type of semiconductor material, and the central isolation region is formed from a dielectric. In embodiments of the invention, the first type of semiconductor material is silicon, and the second type of semiconductor material is germanium. Strain is present throughout the first, second and central regions of the fin channel, and the central isolation region dielectric provides additional fin channel isolation. In embodiments of the invention, the dielectric material includes a first region and a second region, wherein the first region is formed from an oxide of the first type of semiconductor material (e.g., silicon dioxide), and the second region includes an oxide of a combination of the first type of semiconductor material and the second type of semiconductor material (e.g., a silicon germanium oxide).

In embodiments of the invention, the central isolation region of the channel fin can be formed by growing the bottom SRB region over the substrate and growing the top active region over the bottom SRB region. A layer that includes an oxide of the second type of semiconductor material (e.g., $GeO_2$) is formed along sidewalls of an upper sacrificial portion of the bottom SRB region. At least one anneal operation is applied to the layer and the bottom SRB region, wherein the at least one anneal operation is sufficient to result in the layer and the upper sacrificial portion of the bottom SRB region interacting to convert the upper sacrificial portion of the bottom SRB region to the central isolation region of the fin channel. In some embodiments of the invention, the at least one anneal operation includes a first anneal at a first predetermined temperature. In embodiments of the invention, the at least one anneal operation further includes a second anneal at a second predetermined temperature, wherein the second predetermined temperature is less than the first predetermined temperature.

In embodiments of the invention, wherein the above-described layer is formed from GeO2, and wherein the bottom SRB region of the fin channel is formed from SiGe, the above-described at least one anneal is in an inert gas ambient. The layer of GeO2 will react with the SiGe upper sacrificial portion of the bottom SRB region, thus leading to a condensation of germanium and converting the upper sacrificial portion from SiGe to $SiO_2$, thereby isolating the layer to isolate the bottom SRB region of the channel fin.

In embodiments of the invention, the above-described central isolation region formation process can be well-controlled, as the reaction of $GeO_2$ with the SiGe in the SiGe upper sacrificial portion of the bottom SRB region only occurs during the anneal, which can, in some embodiments be a spike anneal at a temperature of about 500 degrees Celsius. At these temperatures, there is no reaction of $GeO_2$ with pure silicon. Accordingly, the annealing method of the present invention is highly selective to SiGe. During the novel central isolation region formation process, the reaction of $GeO_2$ with SiGe in the upper sacrificial portion of the bottom SRB region selectively oxidizes silicon in the exposed sacrificial SiGe region and condenses germanium in the oxide layer according to the reaction described in FIG. 3. As the reaction proceeds, more Si in the sacrificial SiGe region is oxidized to $SiO_2$, and the surface of the SiGe upper sacrificial portion is continuously enriched with more germanium.

The selective $SiO_2$ formation in this manner is self-limited and will continue until either all of the $GeO_2$ is consumed or the SiGe surface becomes sufficiently enriched with germanium that the reaction cannot proceed. In the Si-limited scenario (e.g., a relatively thick GeO2 layer is deposited), the reaction will stop when available silicon atoms are not enough at the SiGe surface. Consequently, the severity of the central isolation region formation process can be tuned by adjusting the thickness of the $GeO_2$ layer that has been deposited on the upper sacrificial region of the fin channel, or by adjusting the anneal temperature/duration.

Accordingly, embodiments of the invention provide a novel fabrication method and resulting structure for a fin-type transistor (e.g., FinFET) having selective isolation of the bottom SRB region of the channel fin. The selective isolation can be achieved by converting an upper sacrificial portion of the bottom fin to an oxide layer (e.g., the central isolation region) at a low temperature without oxygen ambient. Embodiments of the invention can resolve the intrinsic challenges of fabricating strained (e.g., germanium) channel fins of a FinFET on a bulk substrate (e.g., silicon). More specifically, in embodiments of the invention, the height of the active region of the channel fin does not rely on an STI recess process. Accordingly, embodiments of the invention facilitate the fabrication of fin-type transistors (e.g., Fin-FETs) having accurately defined active fin (e.g., the Ge top active region) heights, as well as accurately defined fin widths. Embodiments of the invention further facilitate the fabrication of fin-type transistors (e.g., FinFETs) that avoid undesirable dopant diffusion into the active fin (e.g., the Ge top active region) from a punch-through stopper (PTS) layer. Embodiments of the invention further facilitate the fabrication of fin-type transistor (e.g., FinFETs) that avoid parasitic channel formation in the bottom SRB region of the fin channel (e.g., the SiGe bottom SRB region) due to the out-diffusion of dopants from the source/drain regions of the FET.

Figure 2:
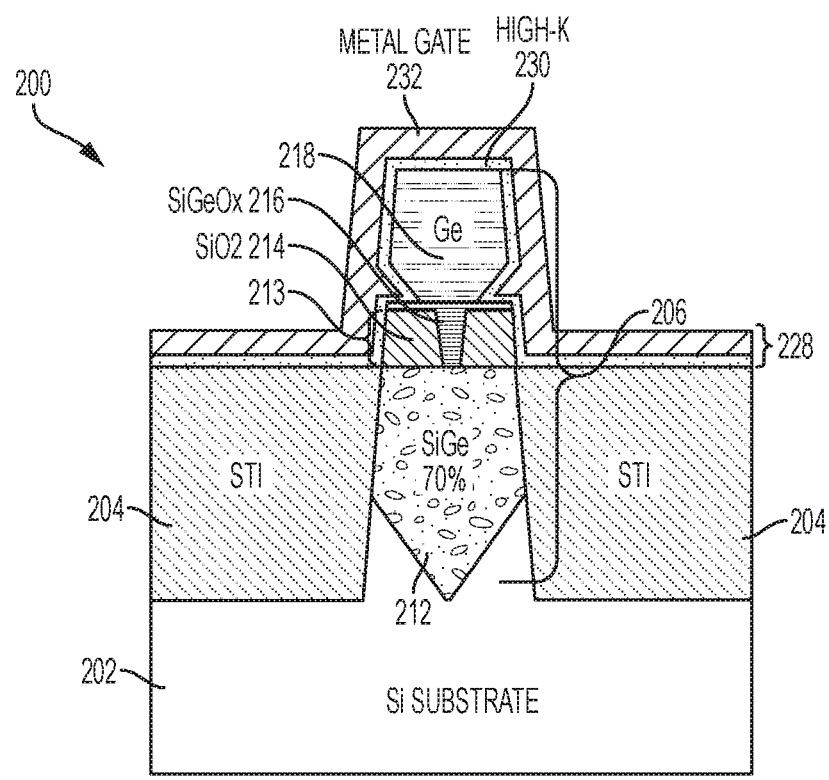
FIG. 2 depicts a cross-sectional view of an oxide-isolated, strained channel FinFET on a bulk substrate according to embodiments of the invention.

Turning now to a more detailed description of aspects of the present invention, FIG. 2 depicts a cross-sectional view of an oxide-isolated, strained channel FinFET device 200 on a bulk silicon substrate 202 according to embodiments of the invention. The device 200 includes the substrate 202, STI regions 204, a channel fin 206, and a gate structure 228, configured and arranged as shown. Although the FinFET device 200 is shown in a two-dimensional (2D) cross-section view, it is understood that in practice the device 200 has 3D contours that correspond to the 3D view of the known FinFET device 100 shown in FIG. 1. Additionally, although not shown in FIG. 2, a 3D view of the channel fin 228 would include source regions and drain regions formed at opposite ends of the channel fin 228, which is similar in structure to the source 108 and the drain 110 positioned at opposite ends of the channel fin 112 shown in FIG. 1.

As shown in FIG. 2, the channel fin 206 includes a bottom SRB region 212, a central isolation region 213, and a top active region 218, configured and arranged as shown. In embodiments of the invention, the bottom SRB region 212 is formed from SiGe 70%. The notation "SiGe 70%" means that 70% of the SiGe is Ge. In embodiments of the invention, the central isolation region 213 includes a centrally located first region 216 formed from SiGeOx, along with a circumferentially located second region 214 formed from SiO2. In embodiments of the invention, the top active region 218 of the channel fin 206 can be formed from pure Ge. In embodiments of the invention, the gate structure 228 includes a metal gate 232 and a high-k dielectric layer 230, configured and arranged as shown. In some embodiments of the invention, the metal gate 232 and the high-k dielectric layer 230 are each formed from multiple layers.

In accordance with embodiments of the invention, strain is provided throughout the novel configuration of the fin channel 206 by forming the fin channel 206 from the SiGe 70% bottom SRB region 212, the dielectric central isolation region 213, and the Ge top active region 218. In accordance with embodiments of the invention, the central isolation region 213, which includes a centrally located first region 216 formed from SiGeOx, along with a circumferentially located second region 214 formed from SiO2, provides additional isolation to the channel fin 206.

Accordingly, the FinFET device 200 resolves the intrinsic challenges of fabricating strained channel fins of a FinFET on a bulk substrate. More specifically, in the device 200, the height of the top active region 218 does not rely on an STI recess process. Accordingly, the device 200 can be fabricated having an accurately defined height of the active fin 218, as well as accurately defined widths of the active fin 218. The device 200 avoids undesirable dopant diffusion into the active fin 218 from a PTS layer, which is not required in the device 200. The device 200 avoids parasitic channel formation in the bottom SRB region 212 due to the out-diffusion of dopants from the source/drain regions (not shown) of the device 200.

In embodiments of the invention, the central isolation region 213 of the channel fin 206 can be formed by growing the bottom SRB region 212 over the substrate 202 and growing the top active region 218 over the bottom SRB region 212. A layer 1402 (shown in FIG. 14) that includes an oxide of Ge (e.g., $GeO_2$) is formed along sidewalls of an upper sacrificial portion 1302 (shown in FIG. 13) of the bottom SRB region 212 (shown as SiGe SRB bottom region 602A in FIG. 13). As will be described in greater detail subsequently herein, the upper sacrificial portion 1302 of the bottom SRB region 212 was a precursor of the central isolation region 213. At least one anneal operation is applied to the layer 1402 and the bottom SRB region 212, wherein the at least one anneal operation is sufficient to result in the layer 1402 and the upper sacrificial portion 1302 of the bottom SRB region 212 interacting to convert the upper sacrificial portion 1302 of the bottom SRB region 212 to the central isolation region 213 of the fin channel 206. In some embodiments of the invention, the at least one anneal operation includes a first anneal at a first predetermined temperature (e.g., a spike anneal at about 500 degrees Celsius) in an N2 ambient. In embodiments of the invention, the at least one anneal operation further includes a second anneal at a second predetermined temperature (e.g., about 450 degrees Celsius), wherein the second predetermined temperature is less than the first predetermined temperature.

Figure 3:
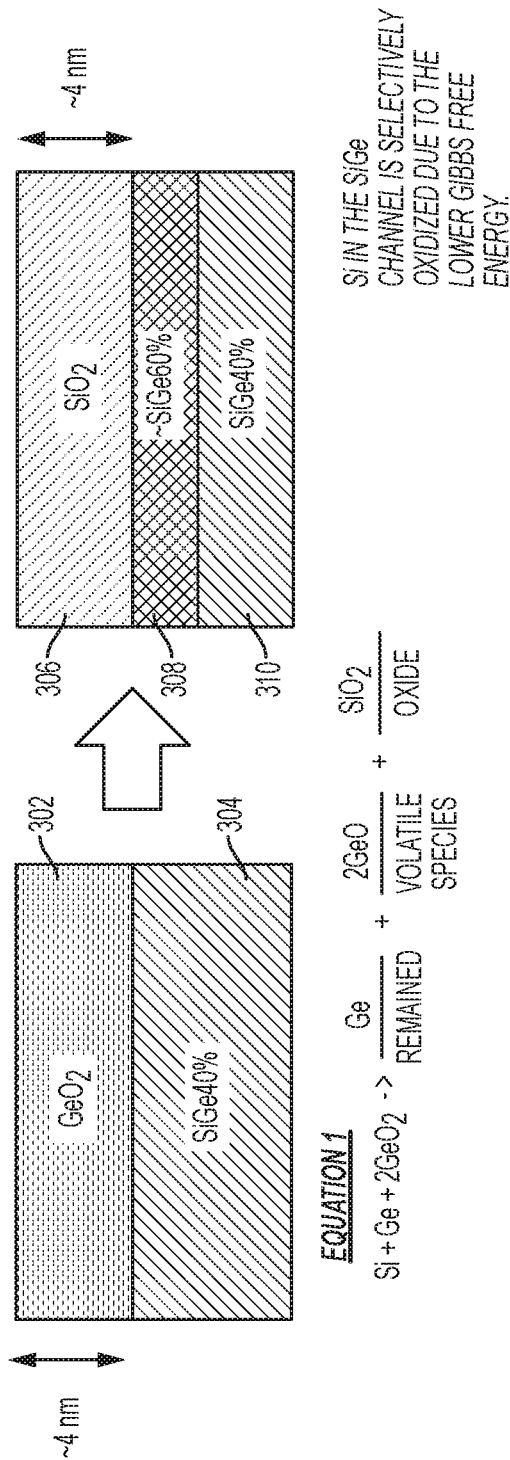
FIG. 3 depicts a diagram illustrating the selective formation of a silicon dioxide layer from an anneal-driven reaction between germanium dioxide and silicon germanium according to embodiments of the invention.

FIG. 3 depicts a diagram illustrating the selective formation of a silicon dioxide layer from an anneal-driven reaction between germanium dioxide and silicon germanium, which is described in the immediately preceding paragraph, and which is in accordance with embodiments of the invention. As shown in FIG. 3, the pre-anneal structure is a GeO2 layer 302 over a SiGe 40% layer 304, and the post-anneal structure is a SiO2 layer 306 formed over a SiGe 60% layer 308 and a SiGe 40% layer 310. The anneal reaction proceeds according to Equation 1 shown in FIG. 3. The GeO2 layer 302 will react with the SiGe 40% layer 304, thus leading to a condensation of germanium and converting the GeO2 layer 302 to $SiO_2$, thereby forming the SiO2 layer 306. During the novel central isolation region formation process, the reaction of $GeO_2$ with SiGe 40% layer 304 selectively oxidizes silicon in the SiGe 40% layer, thus leading to a condensation of germanium at the surface and converting the $GeO_2$ layer 302 to $SiO_2$ layer 306. As the reaction proceeds the ratio of the SiGe layer 310 to the SiGe layer 308 continues to increase until a desired ratio is reached.

A methodology for fabricating the FinFET device 200 according embodiments of the invention will now be described with reference to a semiconductor device 200A shown in FIGS. 4-18 after various fabrication stages. At the end of the fabrication operations shown in FIGS. 4-18, the FinFET device 200 (shown in FIG. 2) is produced.

Figure 4:
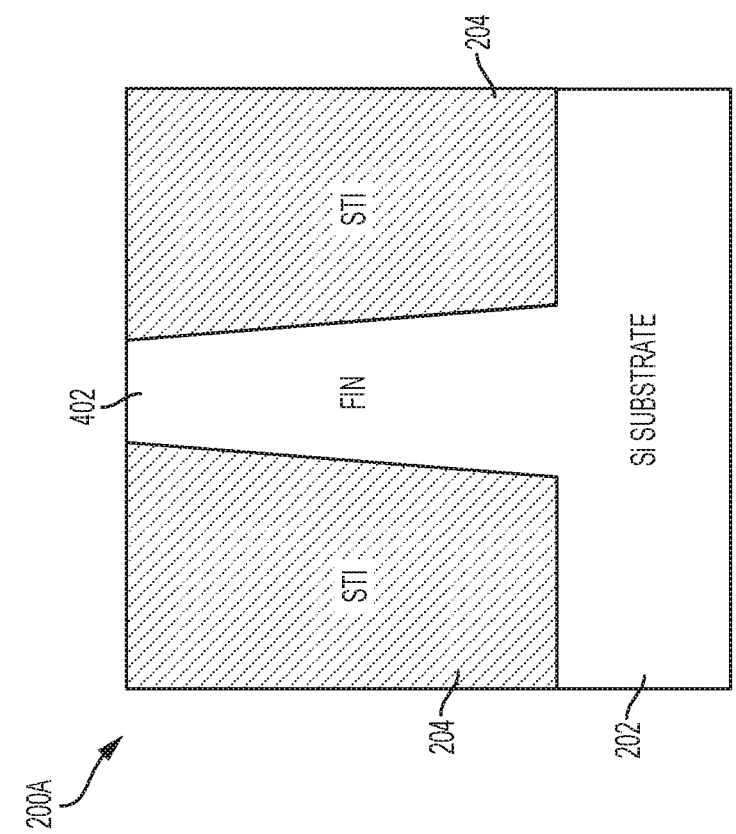
FIG. 4 depicts a cross-sectional view of a semiconductor device after a fabrication operation according to embodiments of the invention.

As shown in FIG. 4, known FET fabrication techniques have been used to form the device 200 to include a substrate 202, a silicon fin 402, and STI regions 204, configured and arranged as shown.

Figure 5:
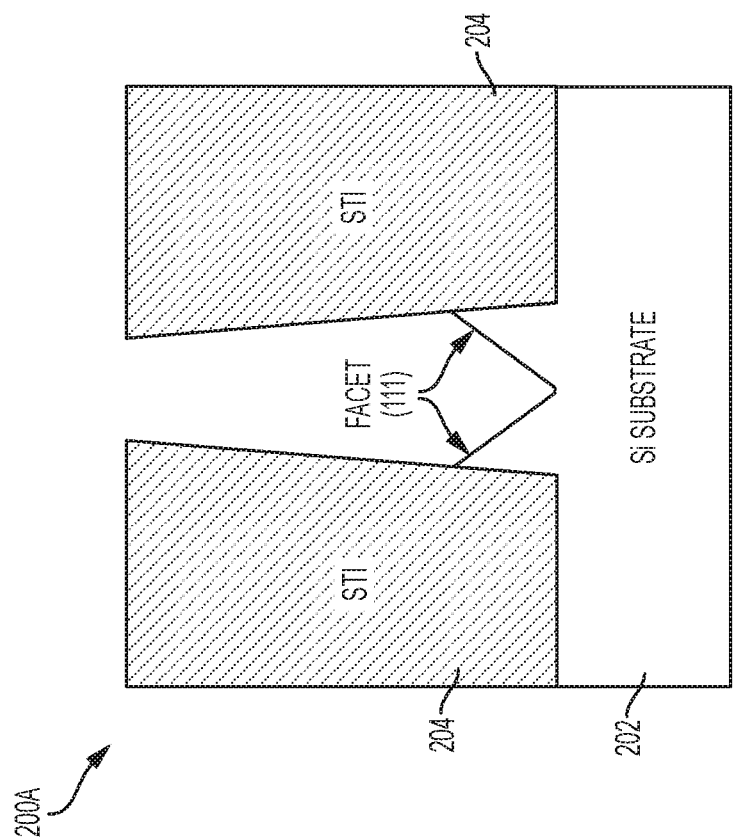
FIG. 5 depicts a cross-sectional view of a semiconductor device after a fabrication operation according to embodiments of the invention.

In FIG. 5, known FET fabrication techniques have been used to selectively remove portions of the silicon fin 402 to form the (111) orientation surface facets as shown. Removal/ etching is any process that removes material from the wafer. Example removal processes include etch processes (either wet or dry), chemical-mechanical planarization (CMP), and the like. In embodiments of the invention, the silicon fin 402 is etched using a wet etch formed from KOH.

Figure 6:
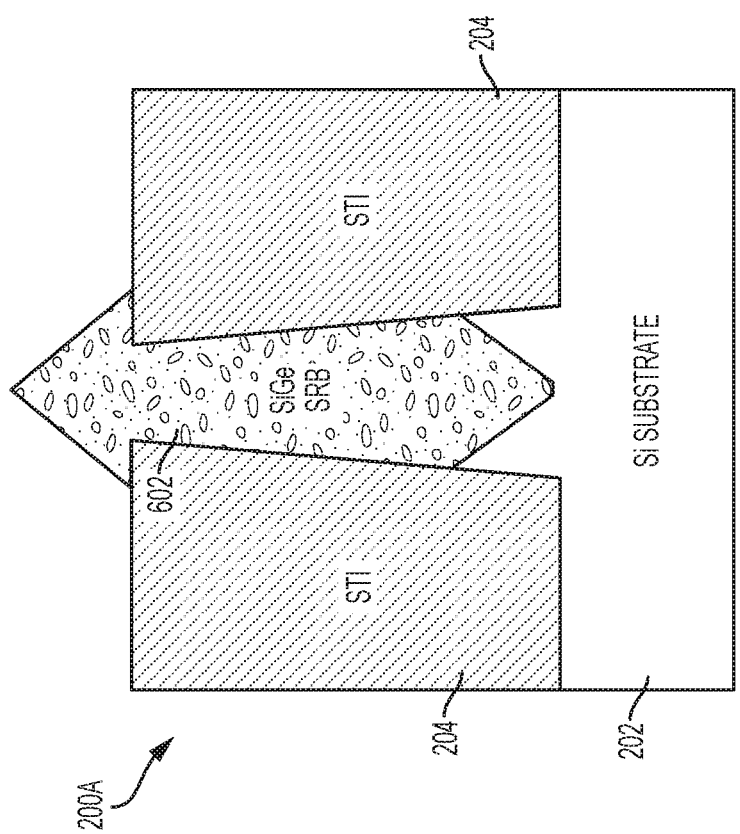
FIG. 6 depicts a cross-sectional view of a semiconductor device after a fabrication operation according to embodiments of the invention.

In FIG. 6, known FET fabrication techniques have been used to grow a SiGe 70% SRB fin 602 over the silicon substrate 202 and between the STI regions 204. Because of the required height of the SiGe 70% SRB fin 602 (e.g., about 50 nm to about 200 nm), as well as the lattice constant mismatch (e.g., about 3%) between Si and SiGe, defects are present in the SiGe 70% SRB fin 602. However, these defects are captured by the STI regions 204, and are further mitigated by the novel three-region configuration channel 206 (shown in FIG. 2) in accordance with embodiments of the invention.

The SiGe 70% SRB fin 602 can be grown epitaxially. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a <100> orientated crystalline surface will take on a <100> orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 7:
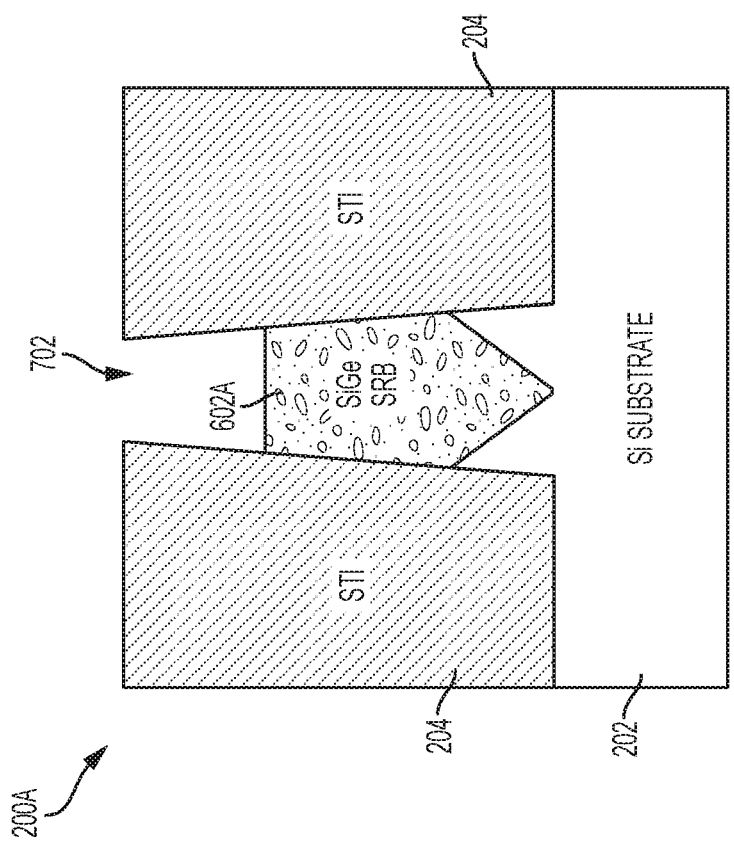
FIG. 7 depicts a cross-sectional view of a semiconductor device after a fabrication operation according to embodiments of the invention.

In FIG. 7, known FET fabrication techniques have been used to polish back (e.g., using CMP) and recess (e.g., using wet chemicals) the SiGe 70% fin 602 (shown in FIG. 6) to form a SiGe 70% bottom portion 602A.

Figure 8:
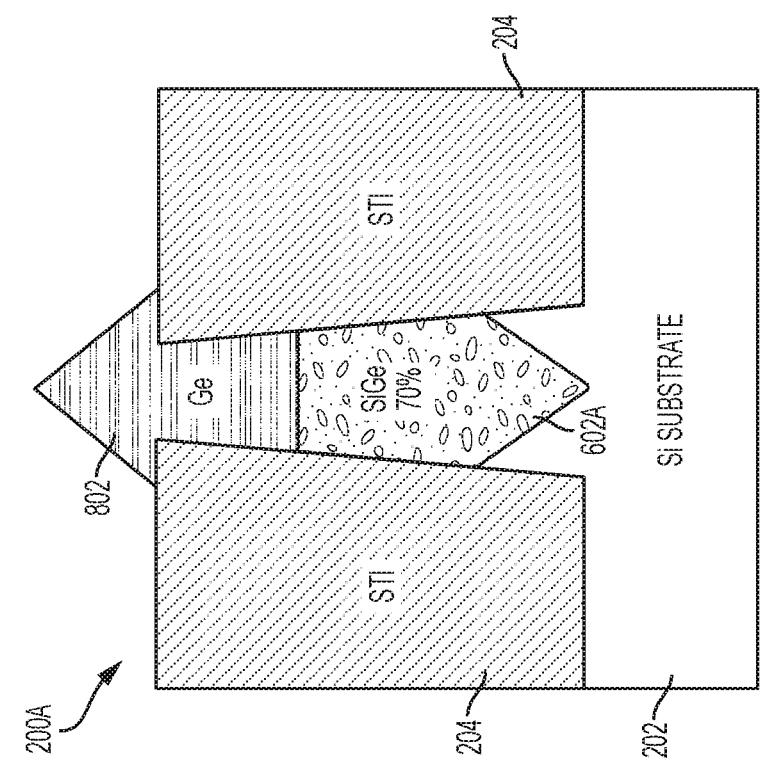
FIG. 8 depicts a cross-sectional view of a semiconductor device after a fabrication operation according to embodiments of the invention.

In FIG. 8, known FET fabrication techniques have been used to grow a pure Ge region 802 over the SiGe 70% SRB bottom portion 602A between and above the STI regions 204. The strain in the SiGe 70% SRB bottom portion 602A will extend to the Ge region 802 because the lattice constant of the Ge region 802 will follow the lattice constant of the SiGe 70% SRB bottom portion 602A. Defects and strain relaxation in the Ge region 802 can be minimized by controlling the height and/or width of the Ge region 802 to stay below levels (e.g., about 30 nm to about 40 nm) at which defects and/or strain relaxation outside of tolerable levels would appear in the Ge region 802. In embodiments of the invention, the Ge region 802 can be grown over the SiGe 70% SRB bottom portion 602A epitaxially.

Figure 9:
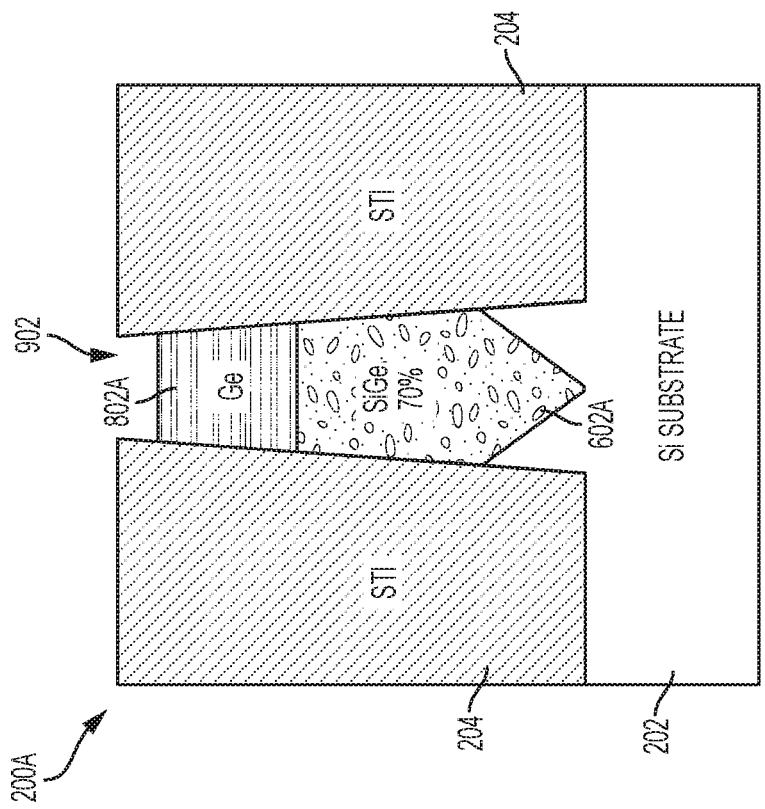
FIG. 9 depicts a cross-sectional view of a semiconductor device after a fabrication operation according to embodiments of the invention.

In FIG. 9, known FET fabrication techniques have been used to polish back (e.g., using CMP) and recess (e.g., using wet chemicals) the Ge region 802 (shown in FIG. 8) to form a Ge region 802A and a trench 902.

Figure 10:
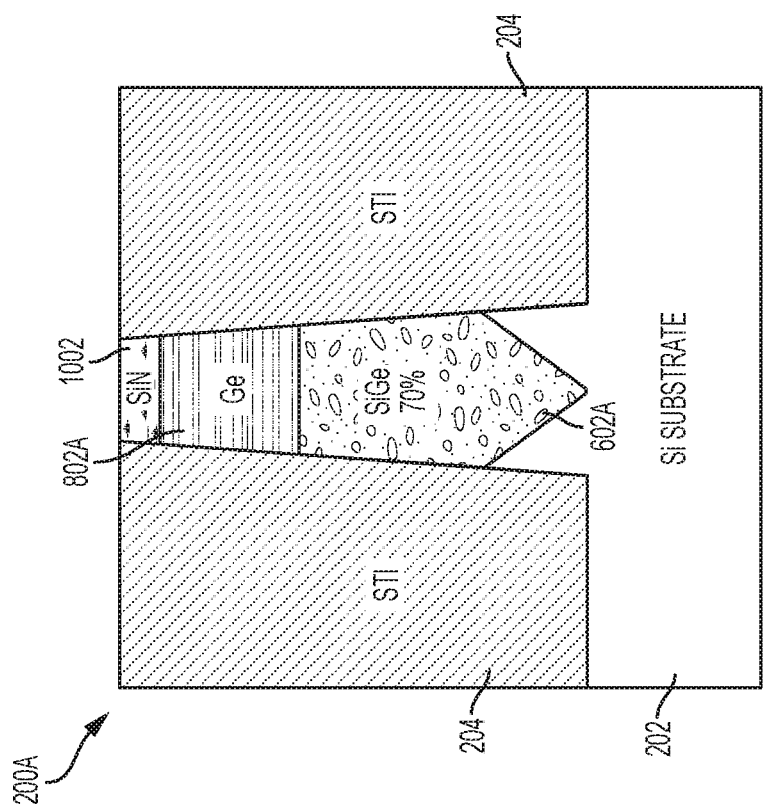
FIG. 10 depicts a cross-sectional view of a semiconductor device after a fabrication operation according to embodiments of the invention.

In FIG. 10, known FET fabrication techniques have been used to deposit and polish back (e.g., using CMP) a silicon nitride region 1002 in the trench 902 (shown in FIG. 9).

Figure 11:
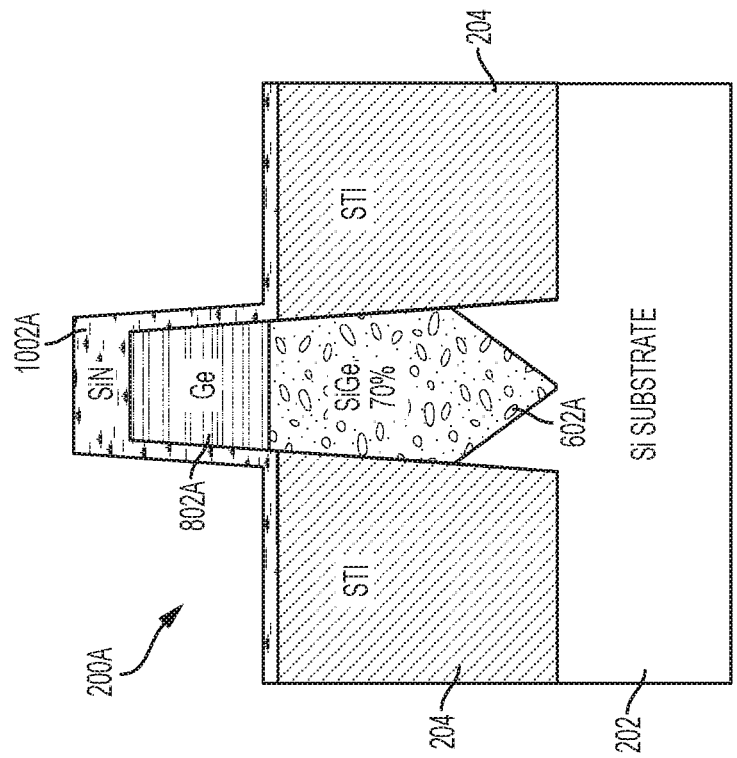
FIG. 11 depicts a cross-sectional view of a semiconductor device after a fabrication operation according to embodiments of the invention.

In FIG. 11, known FET fabrication techniques have been used to recess (e.g., using wet chemicals) the STI regions 204 and conformally deposit an additional layer of SiN over exposed top surfaces of the STI regions 204, sidewalls of the Ge region 802A, and the SiN region 1002 to form a SiN layer 1002A. In embodiments of the invention, the STI regions 204 are recessed such that the top surface of the STI regions 204 are substantially coplanar with the border between the SiGe 70% SRB bottom portion 602A and the Ge region 802A.

Figure 12:
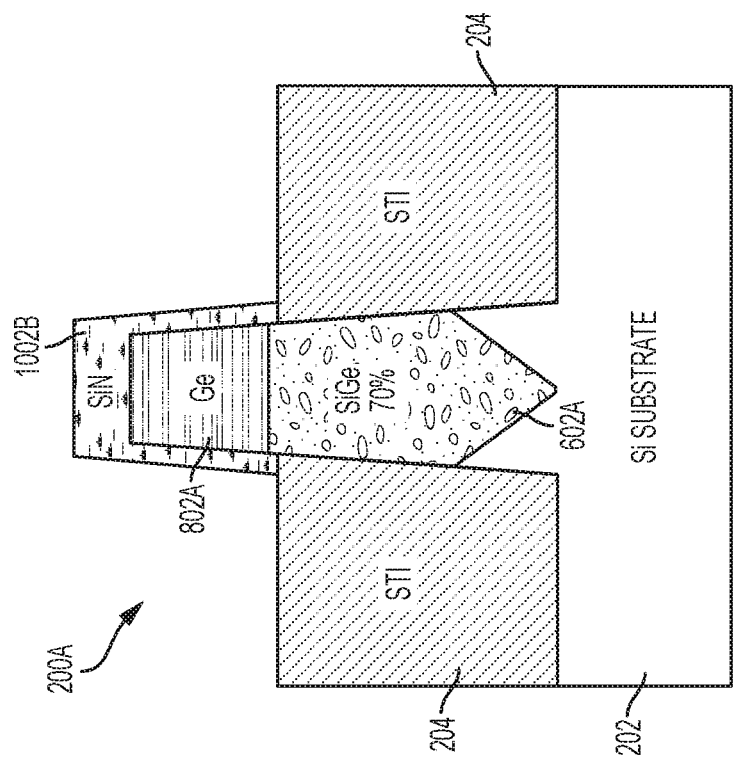
FIG. 12 depicts a cross-sectional view of a semiconductor device after a fabrication operation according to embodiments of the invention.

In FIG. 12, known FET fabrication techniques have been used to remove (e.g., using a direction RIE) the SiN layer 1002A (shown in FIG. 11) from top surfaces of the STI regions 204, resulting in the SiN layer 1002B.

Figure 13:
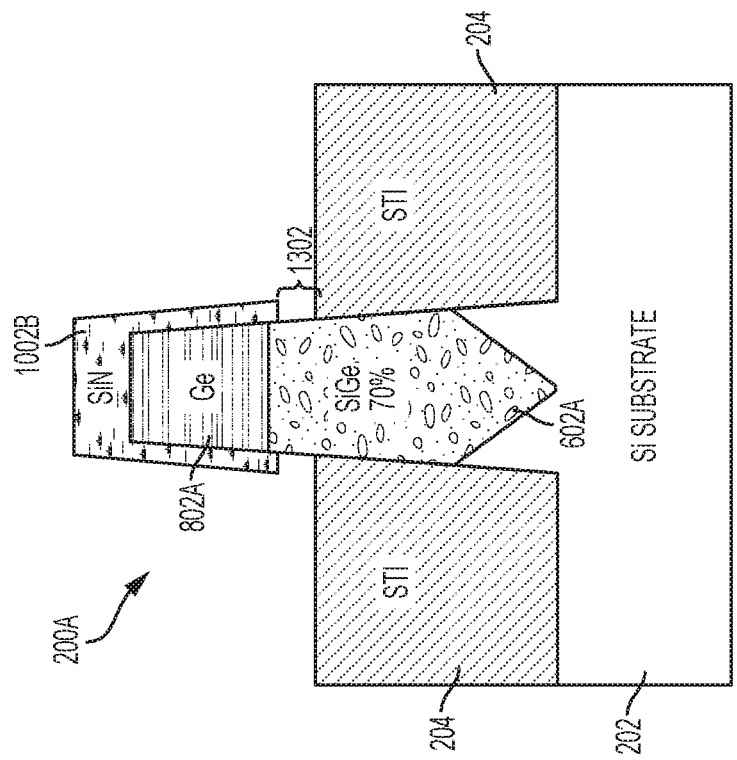
FIG. 13 depicts a cross-sectional view of a semiconductor device after a fabrication operation according to embodiments of the invention.

In FIG. 13, known FET fabrication techniques have been used to remove (e.g., using a gaseous etching process or wet chemistry) an additional portion of STI 204 (shown in FIG. 12) and expose portions of the sidewalls of the SiGe 70% SRB bottom region 602A. A sacrificial region 1302 of the SiGe 70% SRB bottom region 602A is defined by the exposed portions of the sidewalls of the SiGe 70% SRB bottom region 602A and will ultimately be processed according to embodiments of the invention to convert the central isolation region 213 (shown in FIG. 2).

Figure 14:
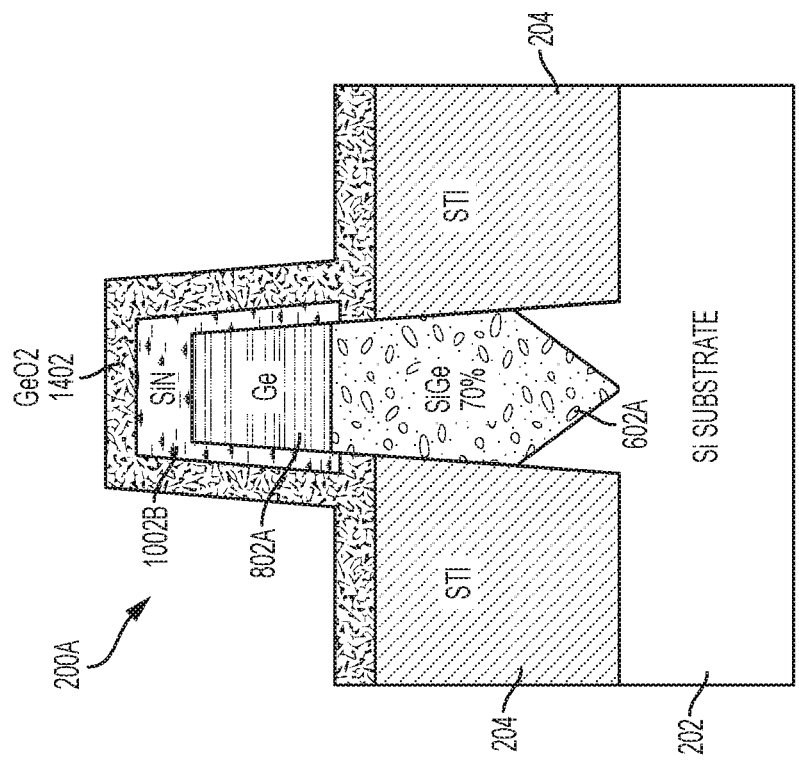
FIG. 14 depicts a cross-sectional view of a semiconductor device after a fabrication operation according to embodiments of the invention.

In FIG. 14, known FET fabrication techniques have been used to conformally deposit (e.g., using ALD) the GeO2 layer 1402 over exposed top surfaces of the STI regions 204, sidewalls of upper sacrificial portion 1302 (shown in FIG. 13), and the SiN layer 1002B.

Figure 15:
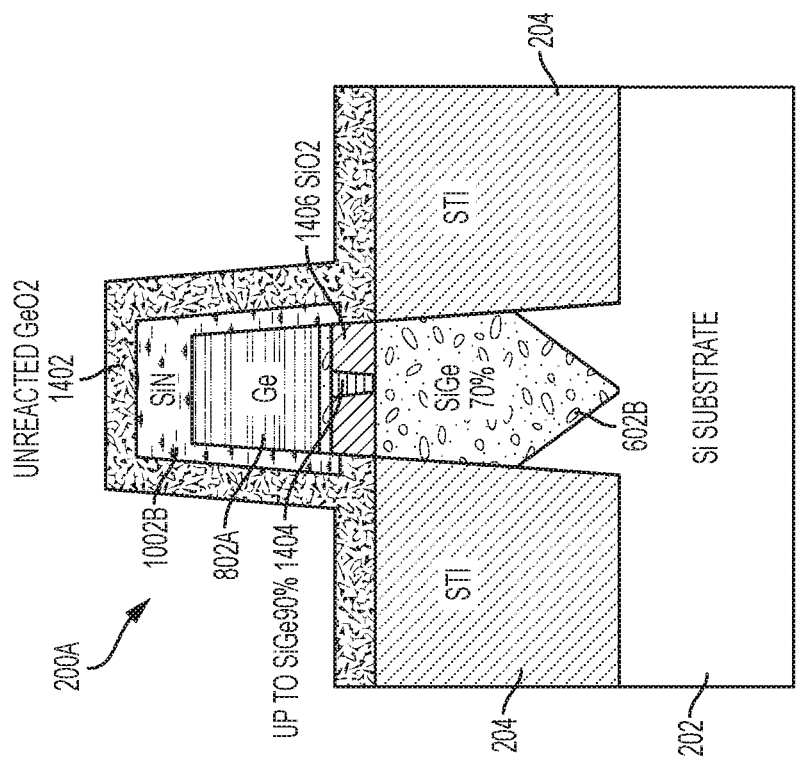
FIG. 15 depicts a cross-sectional view of a semiconductor device after a fabrication operation according to embodiments of the invention.

In FIG. 15, according to embodiments of the invention, a spike anneal is applied to the device 200A at about 500 degrees Celsius in an N2 ambient. Following the reaction described previously herein and illustrated in FIG. 3, GeO2 in the layer 1402 that contacts SiGe in the sidewalls of the upper sacrificial portion 1302 (shown in FIG. 13) converts to SiO2 with Ge condensation, thereby forming a SiO2 region 1406 and a SiGe 90% region 1404 in the upper sacrificial portion 1302.

Figure 16:
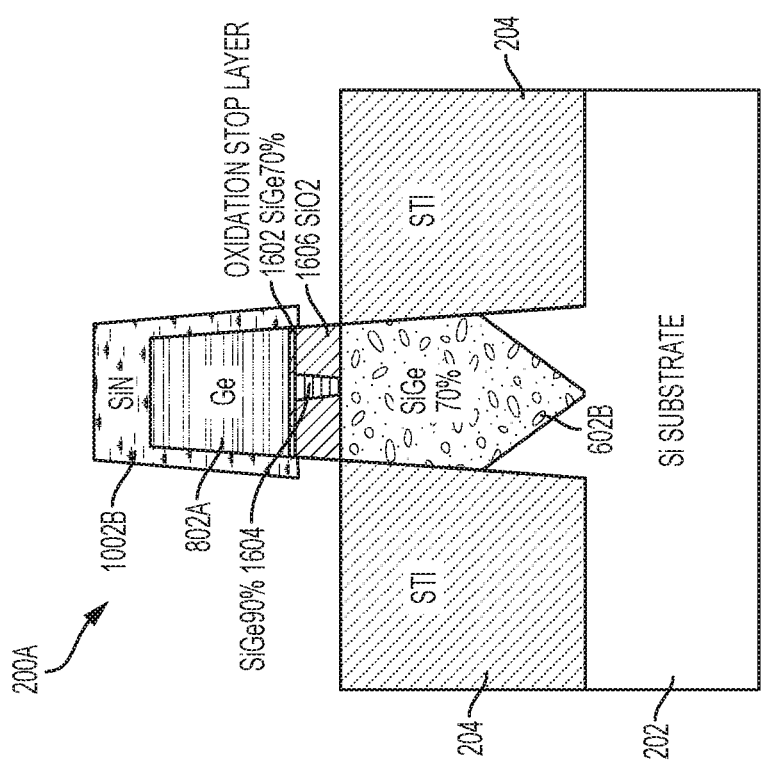
FIG. 16 depicts a cross-sectional view of a semiconductor device after a fabrication operation according to embodiments of the invention.

In FIG. 16, known FET fabrication techniques have been used to remove the unreacted portions of the GeO2 layer 1402. The GeO$_2$ layer 1402 can be removed by exposing it to a water containing wash because GeO$_2$ is water soluble. The SiN layer 1002B was formed to leave a SiGe 70% oxidation stop layer 1602 after the anneal depicted in FIG. 15.

Figure 17:
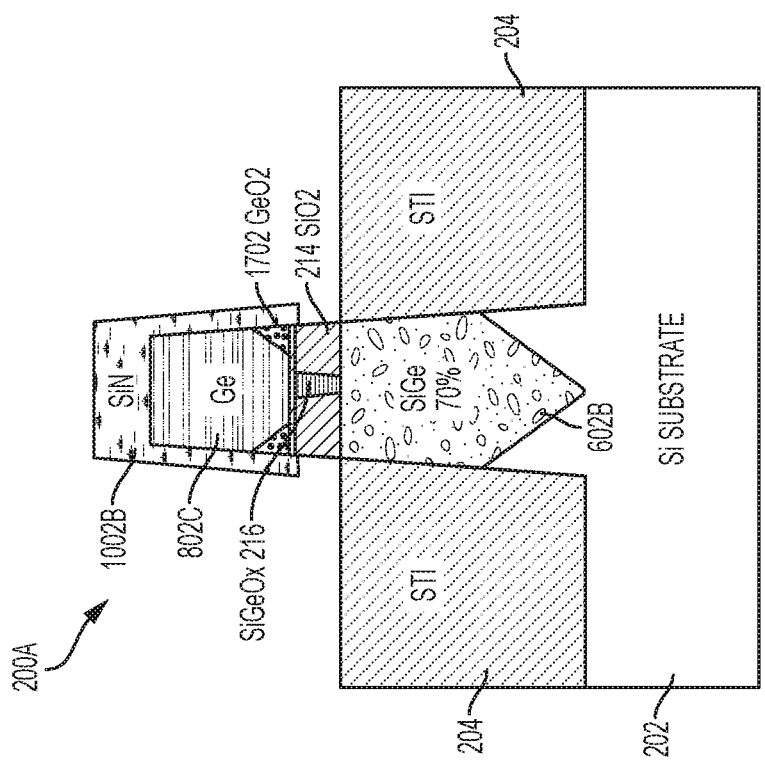
FIG. 17 depicts a cross-sectional view of a semiconductor device after a fabrication operation according to embodiments of the invention.
Figure 19:
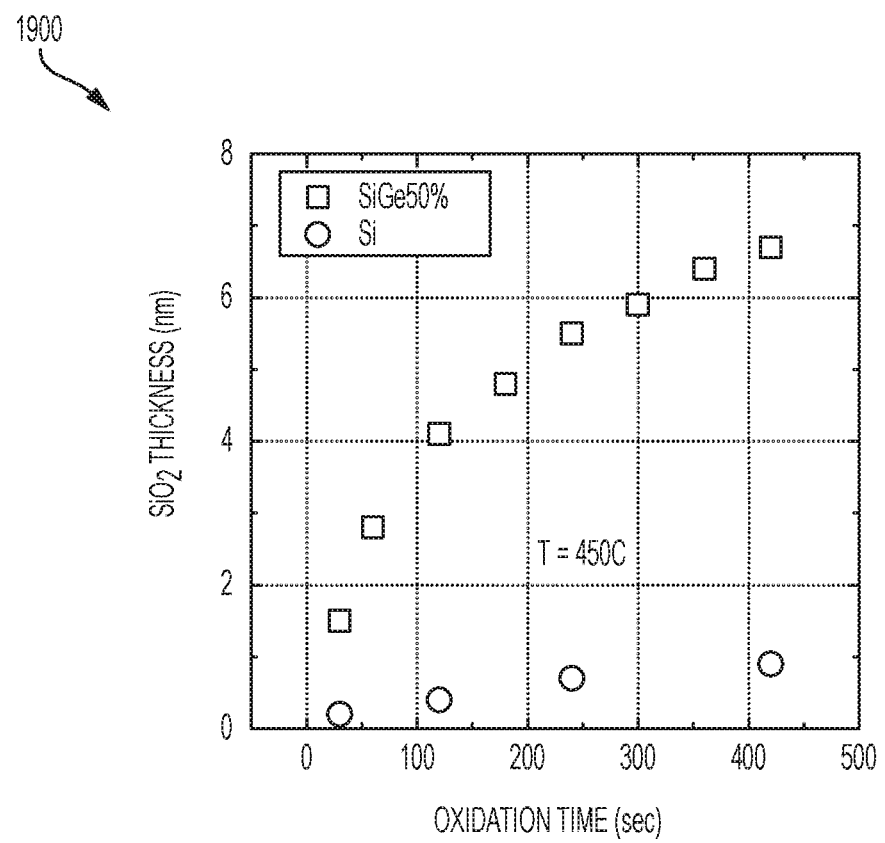
FIG. 19 depicts a diagram illustrating how a high germanium content silicon-germanium layer can be oxidized at low temperatures according to embodiments of the invention.

In FIG. 17, according to embodiments of the invention, a direct oxidation is performed at low temperatures (e.g., at about 450 degrees Celsius), which oxidizes the SiGe 90% layer 1604 (shown in FIG. 16) to form the SiGeOx region 216 (shown in FIGS. 2 and 17). The Ge region 802A, 802C is protected by the SiN layer 1002B, and oxidation of bottom portions (e.g., GeO2 regions 1702) of the Ge region 802C can be minimized by SiGe 70% oxidation stop layer 1602 (shown in FIG. 16). FIG. 19 depicts a chart 19, which demonstrates various parameters for oxidizing high-Ge content SiGe at low temperatures.

Figure 18:
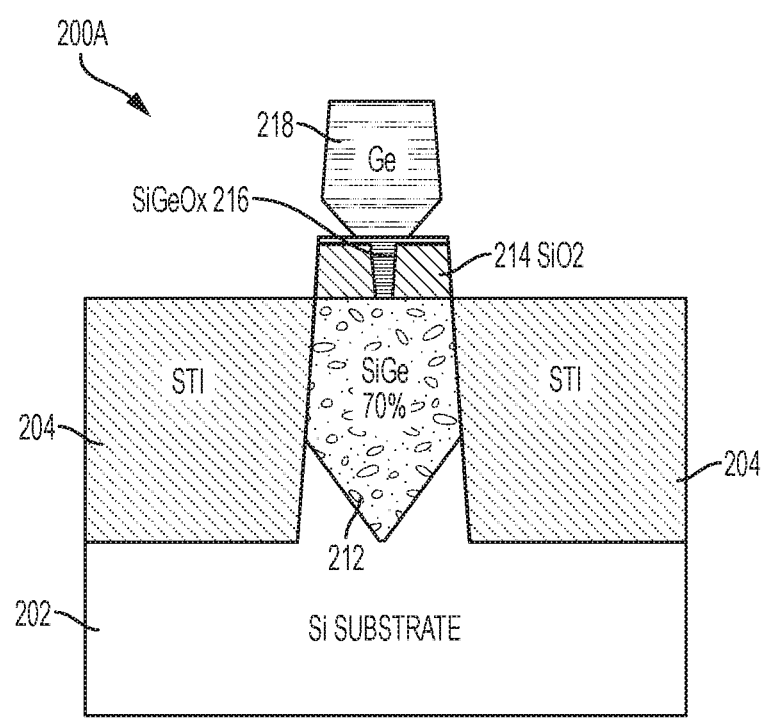
FIG. 18 depicts a cross-sectional view of a semiconductor device after a fabrication operation according to embodiments of the invention.

In FIG. 18, known FET fabrication techniques have been used to remove the SiN layer 1002B and the GeO2 regions 1702 and apply surface cleaning. The GeO$_2$ regions 1702 can be removed by exposing it to a water containing wash because GeO$_2$ is water soluble.

Known FET fabrication techniques are used to form the gate structure 228 on the device 200A shown in FIG. 18, thus forming the FinFET device 200 shown in FIG. 2. The gate structure 228 includes the high-k dielectric 230 and a metal gate 232. The high-k dielectric 230 can be formed from one or more high-k dielectric films (not shown). The high-k dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films can further include dopants such as, for example, lanthanum and aluminum. The high-k dielectric films can be formed by suitable deposition processes, for example, CVD, PECVD, atomic layer deposition (ALD), evaporation, physical vapor deposition (PVD), chemical solution deposition, or other like processes. The thickness of the high-k dielectric films that form the high-k dielectric 230 can vary depending on the deposition process as well as the composition and number of high-k dielectric materials used.

The metal gate 232 can be a work function metal (WFM) deposited over the high-k dielectric 230 by a suitable deposition process, for example, ALD, CVD, PECVD, PVD, plating, thermal or e-beam evaporation, and sputtering. The type of WFM depends on the type of transistor and can differ between the nFET and pFET devices. P-type WFMs include compositions such as titanium nitride, tantalum nitride, ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The WFM can be deposited by a suitable deposition process, for example, ALD, CVD, PECVD, PVD, plating, thermal or e-beam evaporation, and sputtering.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection," and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a substrate comprising a first type of semiconductor material; and
a fin formed on the substrate;
wherein:
the fin comprises a fin channel region configured to include an inactive bottom region configured to not conduct current through the semiconductor device, an inactive central region configured to not conduct current in the semiconductor device, and a top active region configured to conduct current through the semiconductor device;
the central region comprises a dielectric material and couples the bottom region to the top active region;
the top active region comprises a second type of semiconductor material; and
the bottom region comprises a strain relaxed buffer (SRB) region comprising a third type of semiconductor material;
the dielectric material comprises a first region and a second region;
the first region comprises an oxide of the first type of semiconductor material; and
the second region comprises an oxide of a combination of the first type of semiconductor material and the second type of semiconductor material.

2. The device of claim 1 further comprising a shallow trench isolation (STI) region formed along sidewalls of the bottom region of the fin channel region.

3. The device of claim 2 further comprising a gate structure formed along sidewalls of the central region of the fin channel region, sidewalls of the top active region of the fin channel region, and a top surface of the top active region of the fin channel region.

4. The device of claim 3 further comprising the gate structure formed along a top surface of the STI region.

5. The device of claim 3, wherein the gate structure comprises a metal gate region and a high-k dielectric region.

6. The device of claim 3, wherein the fin further comprises a source region and a drain region.

7. The device of claim 1, wherein the bottom region further comprises a faceted region comprising the first type of semiconductor material and having faceted surfaces at an interface between the faceted region and the SRB region.

8. The device of claim 1, wherein:
the first type of semiconductor material comprises silicon;
the second type of semiconductor material comprises germanium;
the third type of semiconductor material comprises silicon germanium; and
the SRB region comprises 70% germanium.

9. A method of forming a semiconductor device, the method comprising:
forming a substrate comprising a first type of semiconductor material; and
forming a fin formed on the substrate;
wherein:
the fin comprises a fin channel region configured to include an inactive bottom region comprising a strain relaxed buffer (SRB) configured to not conduct current through the semiconductor device, an inactive central region configured to not conduct current through the semiconductor device, and a top active region configured to conduct current through the semiconductor device;
the central region comprises a dielectric material and couples the bottom region to the top active region;
the top active region comprises a second type of semiconductor material; and
the bottom region comprises a third type of semiconductor material;
the dielectric material comprises a first region and a second region;
the first region comprises an oxide of the first type of semiconductor material; and
the second region comprises an oxide of a combination of the first type of semiconductor material and the second type of semiconductor material;
wherein forming the fin comprises:
forming the bottom region;
forming the top region over the bottom region; and
converting a top portion of the bottom region to the central region by depositing a layer of a fourth type of semiconductor material on sidewalls of the top portion of the central region, applying an anneal, without an oxygen ambient, to the layer and the top portion of the bottom region such that the anneal causes a first portion of the fourth type of semiconductor material in the layer to enter the top portion of the bottom region and react with a first portion of the third type of semiconductor material in the top portion of the bottom region, wherein the anneal further causes a second portion of the third type of semiconductor material in the top portion of the bottom region to enter the layer and react with a second portion of the fourth type of material in the layer.

10. The method of claim 9 further comprising forming a shallow trench isolation (STI) region along sidewalls of the bottom region of the fin channel region.

11. The method of claim 10 further comprising forming a gate structure along sidewalls of the central region of the fin channel region.

12. The method of claim 11 further comprising forming the gate structure along sidewalls and a top surface of the top active region of the fin channel region.

13. The method of claim 12 further comprising:
forming the gate structure along a top surface of the STI region;
wherein:
the gate structure comprises a metal gate region and a high-k dielectric region;
the fin further comprises a source region and a drain region.

14. The method of claim 9, wherein:
the SRB of the inactive bottom region is formed by:

forming a trench in an isolation region of the substrate such that a bottom surface of the trench comprises a portion of the substrate; and forming the SRB in the trench by epitaxially growing the SRB from the portion of the substrate such that defect formation in the SRB during epitaxial growth is mitigated by sidewalls of the trench.

15. The method of claim 9, wherein the at least one anneal operation comprises a first anneal at a first predetermined temperature.

16. The method of claim 15, wherein the at least one anneal operation further comprises a second anneal at a second predetermined temperature, wherein the second predetermined temperature is less than the first predetermined temperature.

17. The method of claim 14, wherein:
the first type of semiconductor material comprises silicon; and
the second type of semiconductor material comprises germanium.

18. The method of claim 17, wherein:
the third type of semiconductor material comprises silicon germanium; and
the SRB region comprises 70% germanium.

* * * * *